(12) United States Patent
Yoneya (10) Patent No.: US 7,186,634 B2
(45) Date of Patent: Mar. 6, 2007

(54) METHOD FOR FORMING METAL SINGLE-LAYER FILM, METHOD FOR FORMING WIRING, AND METHOD FOR PRODUCING FIELD EFFECT TRANSISTORS

(75) Inventor: Nobuhide Yoneya, Chiba (JP)

(73) Assignee: Sony Corporation, Tokyo (JP)

( * ) Notice: Subject to any disclaimer, the term of this patent is extended or adjusted under 35 U.S.C. 154(b) by 18 days.

(21) Appl. No.: 10/923,372

(22) Filed: Aug. 20, 2004

(65) Prior Publication Data
US 2005/0059193 A1    Mar. 17, 2005

(30) Foreign Application Priority Data
Sep. 11, 2003  (JP)  ............... P2003-319557

(51) Int. Cl.
*H01L 21/44* (2006.01)
(52) U.S. Cl. ............... 438/597; 438/161; 257/E21.158; 257/E21.477
(58) Field of Classification Search ......... 438/149.161, 438/597; 257/E21.158, E21.477
See application file for complete search history.

(56) References Cited

U.S. PATENT DOCUMENTS

| | | | | |
|---|---|---|---|---|
| 4,204,009 A | * | 5/1980 | Feng et al. ................. | 427/510 |
| 4,218,532 A | * | 8/1980 | Dunkleberger ............... | 430/314 |
| 4,917,471 A | * | 4/1990 | Takao et al. ................. | 349/107 |
| 6,740,900 B2 | * | 5/2004 | Hirai ............................ | 257/40 |
| 6,774,393 B2 | * | 8/2004 | Murti et al. ................... | 257/40 |
| 6,847,048 B2 | * | 1/2005 | Yan et al. ..................... | 257/40 |
| 2002/0168807 A1 | * | 11/2002 | Seki ............................ | 438/156 |
| 2003/0068480 A1 | * | 4/2003 | Andry et al. ................ | 438/677 |

OTHER PUBLICATIONS

S. Wolf, R.N. Tauber, Silicon Processing, 1986, Lattice Press, vol. 1—Processing Technology, pp. 535-536.*
Encyclopedia, Photolithography, 2005, Farlex Inc, http://encyclopedia.thefreedictionary.com/Photolithography.*

* cited by examiner

*Primary Examiner*—Asok Kumar Sarkar
(74) *Attorney, Agent, or Firm*—Bell, Boyd & Lloyd LLP (57) ABSTRACT

A method for producing a field effect transistor having source/drain electrodes of metal single-layer film firmly adhering to the gate insulating film is provided. The method includes forming a gate electrode on a support, forming a gate insulating film on the support and the gate electrode, performing treatment with a silane coupling agent on the surface of the gate insulating film, forming source/drain electrodes of metal single-layer film on the gate insulating film which has been treated with a silane coupling agent, and forming a channel-forming region of semiconductor layer on the gate insulating film held between the source/drain electrodes.

6 Claims, 8 Drawing Sheets

F I G. 1A
[STEP-100]

F I G. 1B
[STEP-100]
(CONTINUED)

F I G. 1C
[STEP-100]
(CONTINUED)

F I G. 1D
[STEP-120]

FIG. 2A

[STEP-120]
(CONTINUED)

FIG. 2B

[STEP-120]
(CONTINUED)

FIG. 2C

[STEP-130]

FIG. 4A [STEP-200]

FIG. 4B [STEP-200] (CONTINUED)

FIG. 4C [STEP-200] (CONTINUED)

FIG. 4D [STEP-230]

FIG. 5

[STEP-240]

(14) acid / base (15)

METHOD FOR FORMING METAL SINGLE-LAYER FILM, METHOD FOR FORMING WIRING, AND METHOD FOR PRODUCING FIELD EFFECT TRANSISTORS

CROSS REFERENCES TO RELATED APPLICATION

This application claims priority to Japanese Patent Application No. P2003-319557, filed on Sep. 11, 2003, the disclosure of which is incorporated by reference herein.

BACKGROUND OF THE INVENTION

The present invention relates to a method for forming metal single-layer film, a method for forming wiring, and a method for producing field effect transistors.

Any semiconductor device having an insulating $SiO_2$ film and a gold or platinum layer (for wiring or electrode) formed directly thereon involves difficulty with adhesion between them. A common way to prevent the metal layer from peeling off from the insulating layer is to interpose an adhesion layer of titanium or chromium between them.

The disadvantage of the multi-layer structure having a metal layer and an adhesion layer is that their patterning sometimes present difficulties under some etching conditions. Another disadvantage is an increased production cost due to additional materials and processes, caused by forming the adhesion layer. Moreover, the titanium adhesion layer decreases the channel mobility through the entire transistor (due to charge movement between titanium and channel) in the case of a semiconductor device having a channel-forming region which is in contact with both the source/drain electrodes of gold and the adhesion layer of titanium.

SUMMARY OF THE INVENTION

The present invention provides in an embodiment a method for forming a metal single-layer film which firmly adheres to an $SiO_2$ substrate, to provide a method for forming wiring which firmly adheres to an $SiO_2$ substrate, and to provide a method for producing a field-effect transistor which has source-drain electrodes of metal single-layer film firmly adhering to a gate insulating film or substrate.

In carrying out the invention and according to an embodiment, there is provided a method for forming a metal single-layer film on the surface of a substrate, the method including treating the surface of a substrate with a silane coupling agent before forming the metal single-layer film.

According to another embodiment of the invention, there is provided a method for forming wiring, which relates to a lift-off method. The method includes forming on a substrate a resist layer from which the part where wiring is to be formed has been removed; treating with a silane coupling agent the exposed surface of the substrate; forming a metal single-layer film on the resist layer and the substrate; and removing the resist layer in such a way as to leave on the substrate the wiring of metal single-layer film.

According to an embodiment of the invention, there is provided a method for forming wiring, which relates to etching. The method includes treating with a silane coupling agent the surface of a substrate; forming a metal single-layer film on the surface of the substrate which has been treated with a silane coupling agent; and selectively removing the metal single-layer film by etching, thereby forming wiring of metal single-layer film on the substrate.

According to an embodiment of the invention, there is provided a method for producing a field-effect transistor. The method includes forming a gate electrode on a support; forming a gate insulating film on the gate electrode; treating with a silane coupling agent the surface of the gate insulating film; forming source/drain electrodes of metal single-layer film on the gate insulating film which has been treated with a silane coupling agent; and forming a channel-forming region of semiconductor material on the gate insulating film between the source/drain electrodes.

According to an embodiment of the invention, there is provided a method for producing a field-effect transistor. The method includes treating with a silane coupling agent the surface of a substrate; forming source/drain electrodes of metal single-layer film on the surface of the substrate which has been treated with a silane coupling agent; forming a layer of semiconductor material on the source/drain electrodes and the substrate between them, thereby forming a channel-forming region of semiconductor layer between the source/drain electrodes; forming a gate insulating film on the layer of semiconductor material; and forming a gate electrode on the gate insulating film.

The present invention involves treatment with a silane coupling agent on the surface of a substrate or gate insulating film. This treatment causes the surface of a substrate or gate insulating film to have terminal functional groups, such as thiol groups and the like. These functional groups promote adhesion between a substrate or gate insulating film and a metal single-layer film formed thereon. The metal single-layer film formed on a substrate or gate insulating film contributes to improved etching control, reduced material cost, simplified manufacturing process for field effect transistors, and reduced production cost. The metal single-layer film functioning as the source/drain electrodes of field effect transistors offers the advantage that there exists no charge transfer between the channel and the adhesion promoting layer and smooth charge transfer takes place between the channel and the source/drain electrodes. This contributes to improvement in the characteristic properties (channel mobility) of field effect transistors.

Additional features and advantages of the present invention are described in, and will be apparent from, the following Detailed Description of the Invention and the figures.

DETAILED DESCRIPTION OF THE INVENTION

The present invention relates to a method for forming metal single-layer film, a method for forming wiring, and a method for producing field effect transistors.

According to the present invention, the method for forming metal single-layer film to a first embodiment, the method for forming wiring to second and third embodiments, and the method for producing field effect transistors to an embodiment includes a substrate to be treated with a silane coupling agent. Also, the method for producing field effect transistors to an embodiment of the present invention involves a gate insulating film to be treated with a silane coupling agent. The substrate and the gate insulating film may be formed essentially from any material so long as it has an OH groups on its outermost layer because such terminating OH groups permit treatment with a silane coupling agent. An example of such materials is an $SiO_2$-based material. Another example as the substrate is an organic insulating material such as polymethyl methacrylate (PMMA), polyvinylphenol (PVP), polyvinyl alcohol (PVA), polyethylene and the like. The metal single-layer film may be formed from a metal, such as gold (Au), platinum (Pt), silver (Ag), palladium (Pd), rubidium (Rb), and rhodium (Rh), which reacts with a thiol group (—SH) and the like.

Examples of the $SiO_2$-based materials include silicon dioxide ($SiO_2$), BPSG, PSG, BSG, AsSG, PbSG, silicon oxide nitride (SiON), SOG (spin on glass), low-dielectric $SiO_2$-based materials and the like. The last one includes, for example, polyaryl ether, cycloperfluorocarbon polymer, benzocyclobutene, cyclic fluorocarbon resin, polytetrafluoroethylene, fluorinated aryl ether, fluorinated polyimide, amorphous carbon, and organic SOG.

The $SiO_2$-based material may be made into the substrate or gate insulating film by any known process, such as physical vapor deposition (PVD) (such as vacuum deposition and sputtering), chemical vapor deposition (CVD), spin coating, printing (such as screen printing and ink jet printing), coating, dipping, casting, and thermal oxidation of silicon that gives $SiO_2$.

The gate insulating film may be formed by oxidizing the surface of the gate electrode. Oxidation may be accomplished by anodizing or $O_2$ plasma oxidation, whose selection depends on the material from which the gate electrode is made. In the case of gold gate electrode, the gate insulating film may be formed thereon by coating the surface of the gate electrode with a linear hydrocarbon having a terminal mercapto group, or an insulating material having functional groups capable of chemically bonding with the gate electrode and the like. This coating may be accomplished by dipping or the like.

The silane coupling agent in an embodiment is a compound represented by $X—Si(OR)_3$, where X denotes a functional group, such as thiol group (mercapto group), amino group, vinyl group, epoxy group, chloro group, and methacryl group, and OR denotes a hydrolyzable group, such as methoxy group and ethoxy group. Examples of the silane coupling agent include 3-mercaptopropyltrimethoxysilane [$(CH_3O)_3SiC_3H_3SH$].

Treatment with a silane coupling agent may be accomplished by exposing the object to a vapor of a silane coupling agent, dipping the object in a solution of a silane coupling agent, coating the object with a solution of a silane coupling agent, and spin-coating the object with a solution of a silane coupling agent. Examples of the coating method include air doctor coating, blade coating, rod coating, knife coating, squeeze coating, reverse roll coating, transfer roll coating, gravure roll coating, kiss coating, cast coating, spray coating, slit orifice coating, and calendar coating.

The gate electrode may be formed from a metal such as gold (Au), platinum (Pt), silver (Ag), palladium (Pd), rubidium (Rb), and rhodium (Rh). Alternatively, the gate electrode may also be formed from a metal such as aluminum (Al), copper (Cu), nickel (Ni), chromium (Cr), tungsten (W), tantalum (Ta), titanium (Ti), indium (In), and tin (Su). The metals may be used in the form of alloy or electrically conductive particles. The gate electrode may take on a laminate structure containing said elements. Another example of the materials for the gate electrode includes electrically conductive polymers, such as poly(3,4-ethylenedioxythiophene)/polystyrenesulfonic acid [PEDOT/PSS] heavily doped silicon and the like.

The metal single-layer film, source/drain electrodes, and gate electrode may be formed by any one of the following methods which is selected depending on the materials used: PVD method such as vacuum deposition and sputtering; CVD method including MOCVD method; spin coating; printing method such as screen printing (with a conductive paste or conductive polymer solution) and ink jet printing; coating methods mentioned above; lift-off method; shadow mask method; plating method such as electrolytic plating and electroless plating; spraying method and the like. These methods may be used in combination with patterning technology. The PVD method can include the following: electron beam heating method, resistance heating method, flash vapor deposition method, and other vacuum vapor deposition method; plasma vapor deposition method; double-pole sputtering method, direct current sputtering method, direct current magnetron sputtering method, high-frequency sputtering method, magnetron sputtering method, ion beam sputtering method, bias sputtering method, and other sputtering method; and DC (direct current) method, RF method, multi-cathode method, activation reaction method, high-frequency ion plating method, reactive ion plating method, and other ion plating methods.

The semiconductor layer may be formed from any of the following materials. 2,3,6,7-dibenzoanthrathene (or pentathene), $C_9S_9$(benzo[1,2-c; 3,4-c'; 5,6-c"]tris[1,2]dithiol-1,4,7-trithione), $C_{24}H_{14}S_6$ (α-sexithiophene), phthalocyanine represented by copper phthalocyanine, fullerene ($C_{60}$), tetrathiotetrathene ($C_{18}H_8S_4$), tetraselenotetrathene ($C_{18}H_8Se_4$), tetratellurotetrathene ($C_{18}H_8Te_4$), and poly(3,4-ethylenedioxythiophene)/polystyrenesulfonic acid [PEDOT/PSS]. Poly(3,4-ethylenedioxythiophene) and polystyrenesulfonic acid are represented respectively by the structural formulas (1) and (2) in FIG. 6.

Figure 6:
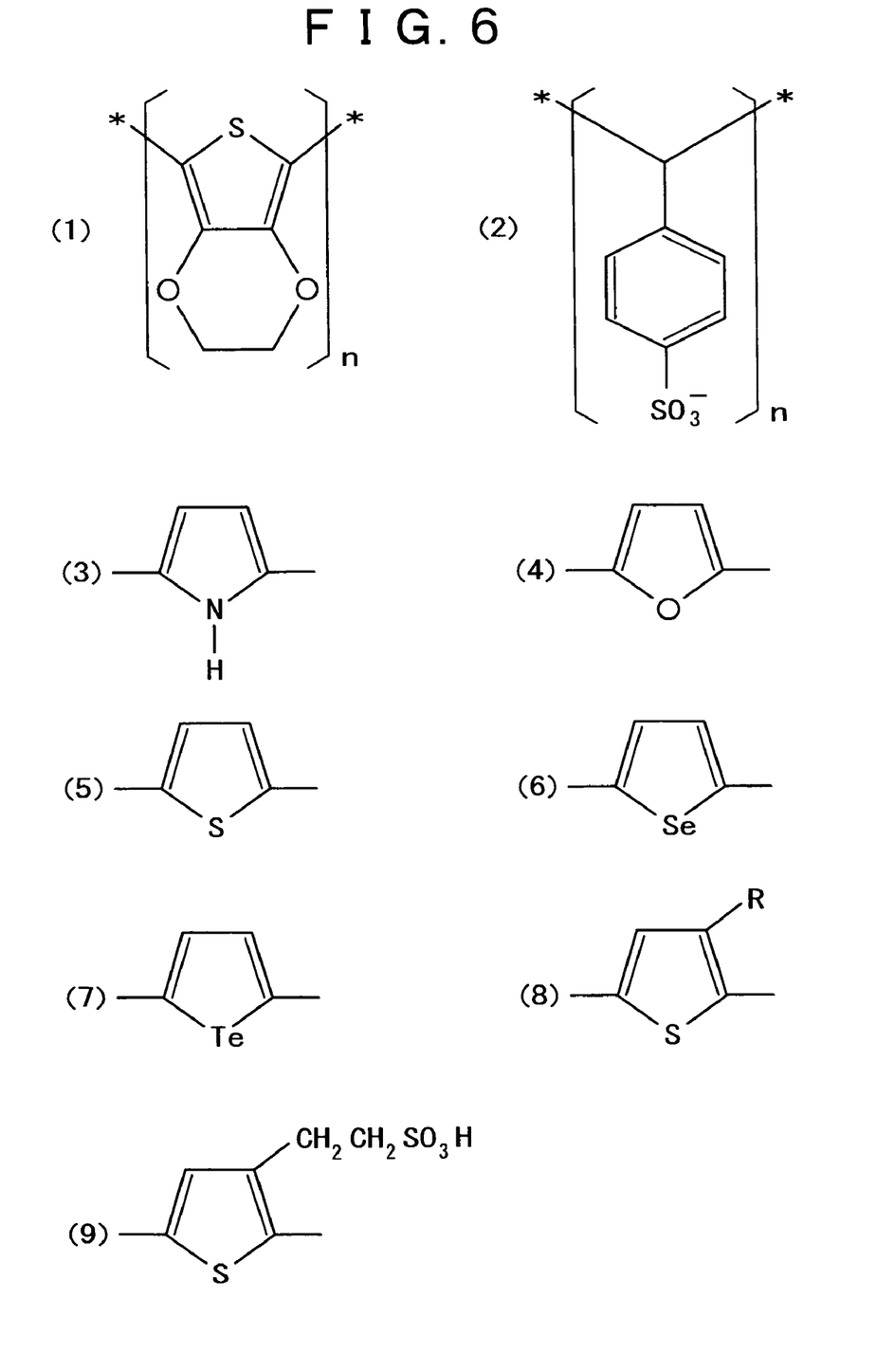
FIG. 6 shows the structural formulas of the conductive polymer material suitable for the semiconductor layer in the present invention.

Alternatively, the semiconductor layer may also be formed from heterocyclic conjugated conductive polymers and heteroatom-containing conjugated conductive polymers, examples of which are identified below. The structural formula has the alkyl group ($C_nH_{2n+1}$) represented by R or R'.

Heterocyclic conjugated conductive polymers
Polypyrrole (structural formula (3) in FIG. 6)
Polyfuran (structural formula (4) in FIG. 6)
Polythiophene (structural formula (5) in FIG. 6)
Polyselenophene (structural formula (6) in FIG. 6)
Polytellurophene (structural formula (7) in FIG. 6)
Poly(3-alkylthiophene) (structural formula (8) in FIG. 6)

Poly(3-thiophene-β-ethanesulfonic acid) (structural formula (9) in FIG. 6)

Figure 7:
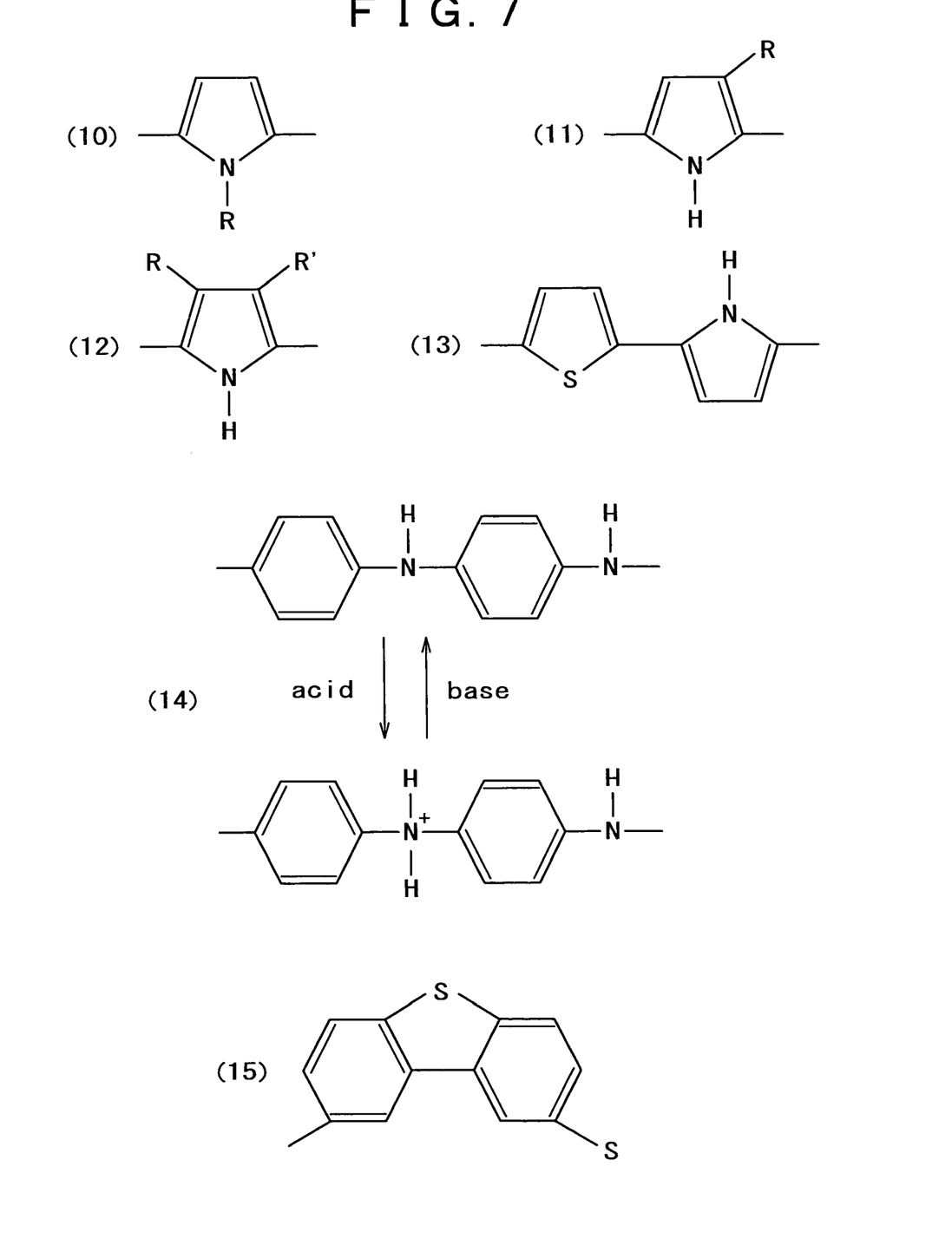
FIG. 7 shows the structural formulas of the conductive polymer material suitable for the semiconductor layer in the present invention.

Poly(N-alkylpyrrole) (structural formula (10) in FIG. 7)
Poly(3-alkylpyrrole) (structural formula (11) in FIG. 7)
Poly(3,4-dialkylpyrrole) (structural formula (12) in FIG. 7)
Poly(2,2'-thienylpyrrole) (structural formula (13) in FIG. 7)

Heteroatom-containing conjugated conductive polymers
Polyaniline (structural formula (14) in FIG. 7)
Poly(dibenzothiophenesulfide) (structural formula (15) in FIG. 7)

Figure 8:
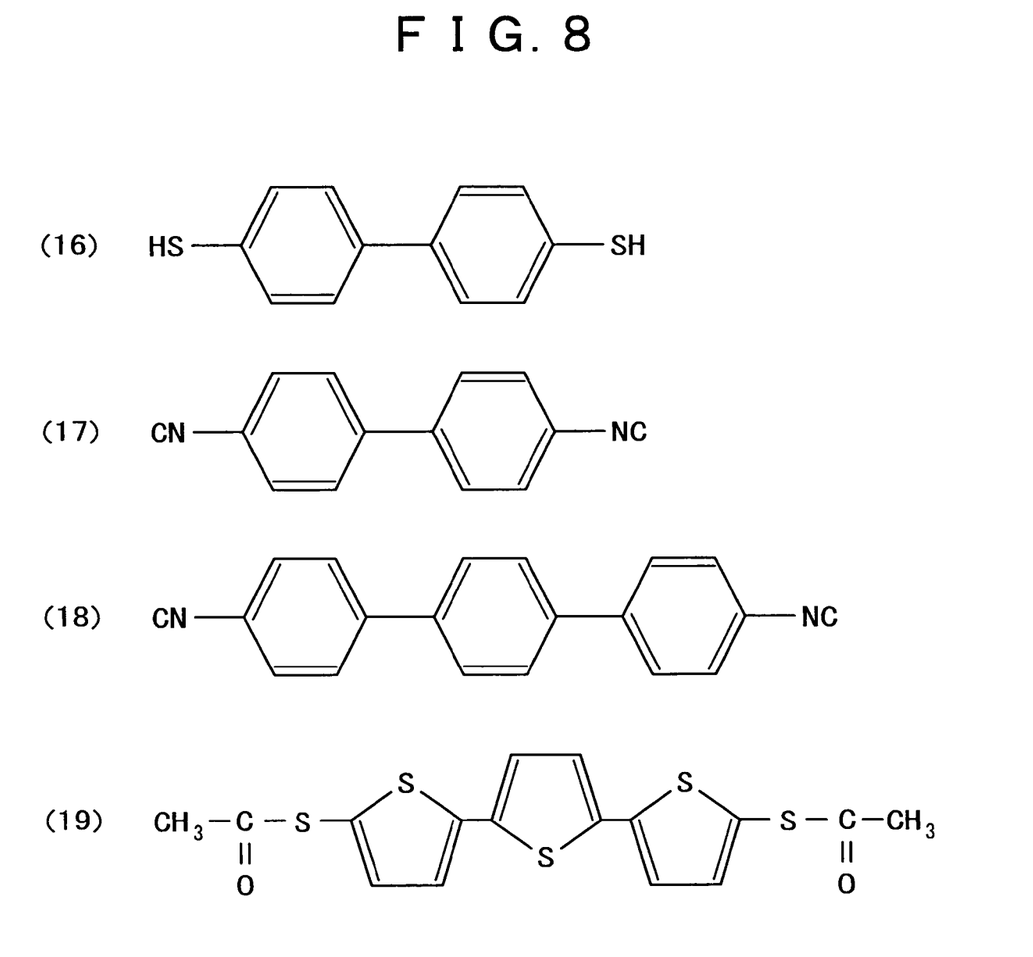
FIG. 8 shows the structural formulas of the conductive polymer material suitable for the semiconductor layer in the present invention.

Additional examples of the material from which the semiconductor layer is formed include organic semiconductor molecules having conjugated bonds and also having on both terminals of the molecule any of thiol group (—SH), amino group (—$NH_2$), isocyano group (—NC), thioacetoxyl group (—$SCOCH_3$), carboxyl group (—COOH) and the like. Typical examples of the organic semiconductor molecule are shown below:

4,4'-biphenyldithiol (structural formula (16) in FIG. 8)
4,4'-diisocyanobiphenyl (structural formula (17) in FIG. 8)
4,4'-diisocyano-p-terphenyl (structural formula (18) in FIG. 8)
2,5-bis(5'-thioacetoxyl-2'-thiophenyl)thiophene (structural formula (19) in FIG. 8)

Moreover, the semiconductor layer may be formed from an inorganic semiconductor material, such as Si, Ge, and Se.

The semiconductor layer (or channel-forming region) of conductive polymer may be formed by any method selected from PVD method (such as vacuum deposition and sputtering), various CVD methods, spin coating, printing methods (such as screen printing and ink jet printing), various coating methods, dipping, stamping, lift-off, shadow mask method, and spraying. The semiconductor layer (or channel-forming region) of inorganic semiconductor may be formed by any of various CVD methods and PVD methods.

The method for producing field effect transistors in an embodiment is intended to form field effect transistors on a support. Examples of the support include glass substrates, glass substrates with an insulating layer formed thereon, quartz substrates, quartz substrates with an insulating layer formed thereon, and silicon substrates with an insulating layer formed thereon. Additional examples include plastic film, sheet or substrate made of polyether sulfone (PES), polyimide, polycarbonate, polyethylene terephthalate (PET), or the like. Those supports made of a flexible polymeric material realize curved displays incorporated with field effect transistors. The resulting field effect transistors may be sealed with a resin. The field effect transistors made by the method for producing field effect transistors, as the second embodiment of the present invention, should preferably be constructed such that the substrate is supported on a support. The support may be formed from any of the above-mentioned materials.

The present invention will be described in more detail with reference to the accompanying drawings. Source/drain electrodes and wiring with good adhesion can be obtained by simple modification of the manufacturing steps without change in structure and wiring of conventional field effect transistors.

EXAMPLE 1

This example demonstrates the method for producing field effect transistors in an embodiment according to the present invention, the method for forming wiring according to an embodiment of the present invention, and the method for forming a metal single-layer film according to an embodiment of the present invention. The field effect transistor, such as thin-film transistor (TFT), obtained in this example has a structure as shown in FIG. 3, which is a schematic partial sectional view taken along a virtual plane perpendicular to the direction in which the gate electrode extends.

The field effect transistor pertaining to Example 1 is that of so-called bottom gate type or TFT of bottom contact type. It is composed of a gate electrode 12 formed on a support, a gate insulating film 13 formed on the gate electrode 12, source/drain electrodes 14 formed on the gate insulating film 13, and a channel-forming region 15 (as a semiconductor layer) formed on the gate insulating film 13 and between the source/drain electrodes 14.

Over the entire surface is formed the inter-layer insulating layer 20 of $SiO_2$, on which is formed the wiring 21. An opening is formed in that part of the inter-layer insulating layer 20 which is above the word wire (extending from the gate electrode 12) and the source/drain electrodes 14. The wiring 21 extends in this opening and connects to the word line and the source/drain electrodes 14.

Figure 3:
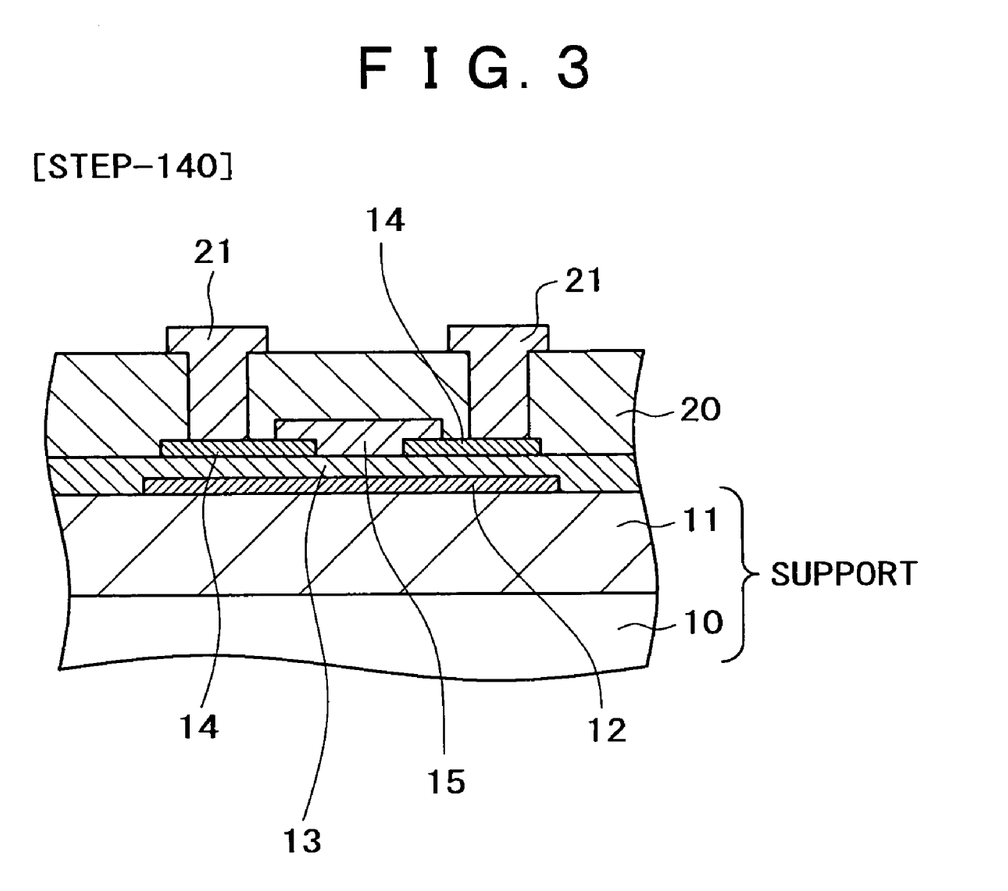
FIG. 3 as the continuation of FIG. 2C is a schematic sectional view illustrating the method for producing the field effect transistor in Example 1.

The TFT shown in FIG. 3 is produced by the method for producing field effect transistors pertaining to the fourth embodiment of the present invention. In this case, the gate electrode 12 which functions also as the word line is regarded as the wiring, and the gate electrode 12 (wiring) is formed by the method for forming wiring pertaining to the second embodiment of the present invention and the wiring 21 on the inter-layer insulating layer 20 is formed by the method for forming wiring pertaining to the third embodiment of the present invention.

In Example 1, the semiconductor layer constituting the channel-forming region 15 was formed from pentathene. And, the support is composed of a glass substrate 10 and an insulating layer 11 of $SiO_2$ formed thereon by sputtering. The gate electrode 12, the source/drain electrodes 14, and the wiring 21 were formed from metal single-layer film of gold (Au). The gate insulating film 13 was formed from $SiO_2$. The inter-layer insulating layer 20 was formed from $SiO_2$. In other words, the insulating layer 11 corresponds to the substrate in the method for forming wiring pertaining to the second embodiment of the present invention, the inter-layer insulating layer 20 corresponds to the substrate in the method for forming wiring pertaining to the third embodiment of the present invention, and the insulating layer 11, the gate insulating film 13, or the inter-layer insulating layer 20 corresponds to the substrate in the method for forming metal single-layer film pertaining to the first embodiment of the present invention.

The following is an outline of the method for producing the field effect transistor in Example 1. The outline will be explained with reference to FIGS. 1 to 3, which are schematic sectional views as previously discussed.

Step 100

The first step is to form the gate electrode 12 on the support. The insulating layer 11 of $SiO_2$ is formed on the surface of the glass substrate 10. On the insulating layer 11 is formed the resist layer 31, which is subsequently etched by lithography such that the part where the wiring (gate electrode 12) is to be formed is removed (see FIG. 1A). It is desirable to carry out ashing with oxygen plasma to remove residues of the resist layer 31 after the resist layer 31 has been formed.

Figure 1A:
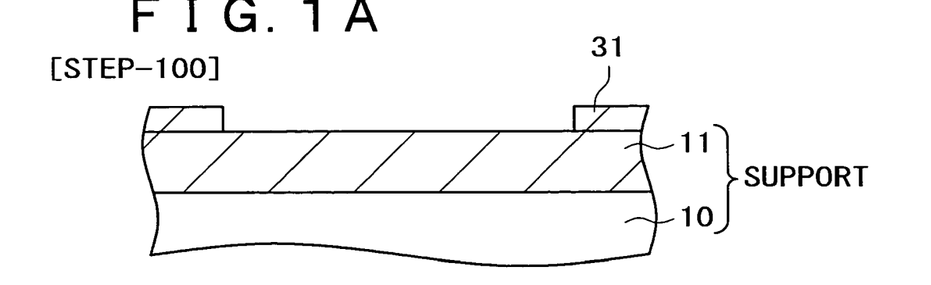
FIGS. 1A to 1D are schematic sectional views illustrating the method for producing the field effect transistor in Example 1.

The exposed substrate (insulating layer 11) is treated with a silane coupling agent by exposure to the vapor of its ethanol solution, followed by drying. The silane coupling agent is 3-mercaptopropyltrimethoxysilane [$(CH_3O)_3SiC_3H_3SH$].

Figure 1B:
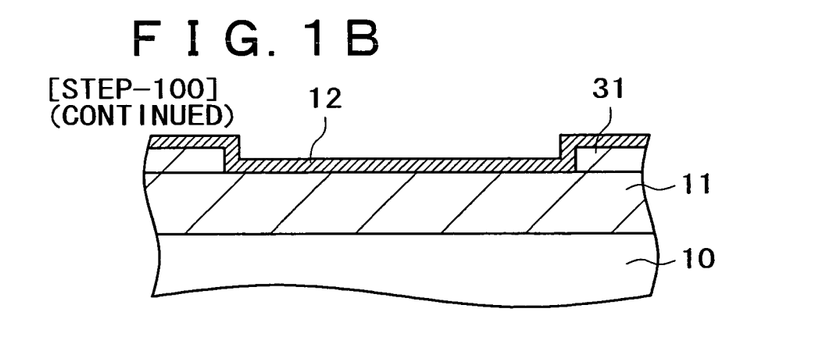
Figure 1C:
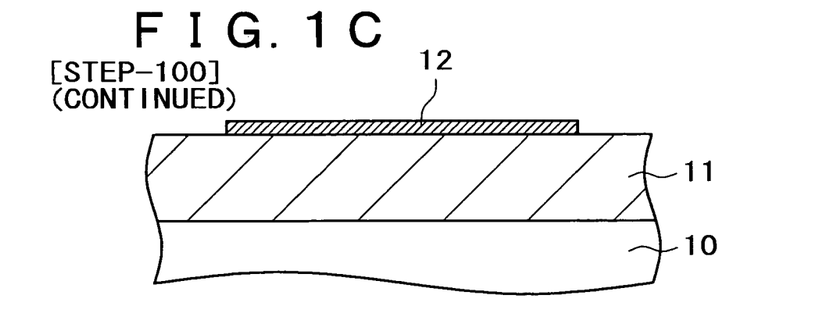
Figure 1D:
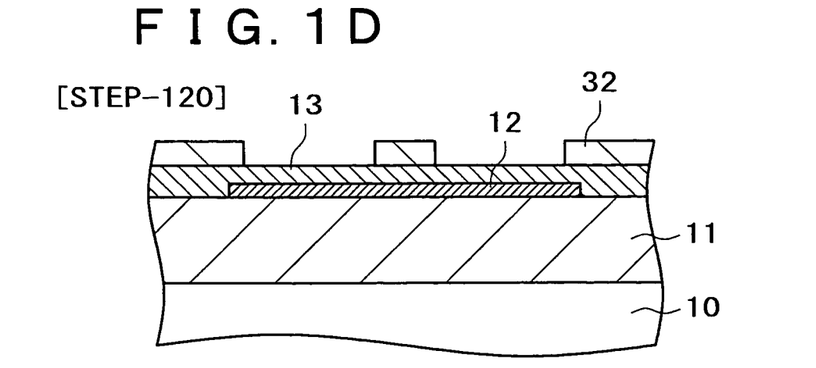

Then a metal single-layer film of gold (Au) is formed on the resist layer 31 and the support (insulating layer 11) by vacuum vapor deposition. In this way, there is obtained the gate electrode 12 composed of metal single-layer film of gold (Au), as shown in FIG. 1). After that, the resist layer 31 is removed by the lift-off method, such that the wiring (gate electrode 12) of metal single-layer film remains on the substrate (insulating layer 11). In this way, the gate electrode 12 (corresponding to the wiring) is formed on the substrate (insulating layer 11) (see FIG. 1C).

Thus Step 100 mentioned above achieves the method for forming metal single-layer film according to an embodiment of the present invention and the method for forming wiring according to another embodiment of the present invention.

Step 110

Then, the gate insulating film 13 is formed on the support (or insulating film 11) including the gate electrode 12. The gate insulating film 13 of $SiO_2$ is formed on the gate electrode 12 and the insulating layer 11 by sputtering. When the gate insulating film 13 is formed, the gate electrode 12 is partly covered by a hard mask, so that the lead-out (not shown) of the gate electrode 12 can be formed without the photolithography process.

Step 120

Then, treatment with a silane coupling agent is performed on the surface of the gate insulating film 13. On the treated gate insulating film 13 are formed the source/drain electrodes 14 of metal single-layer film formed from gold (Au).

Figure 2A:
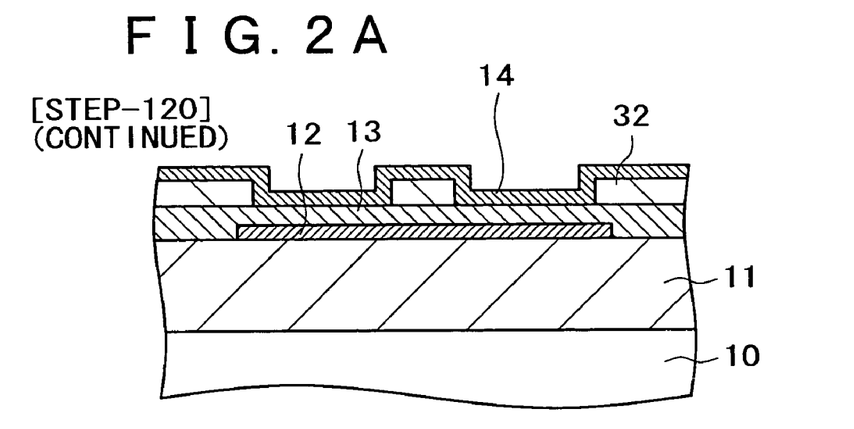
FIGS. 2A to 2C as the continuation of FIG. 1D are schematic sectional views illustrating the method for producing the field effect transistor in Example 1.
Figure 2B:
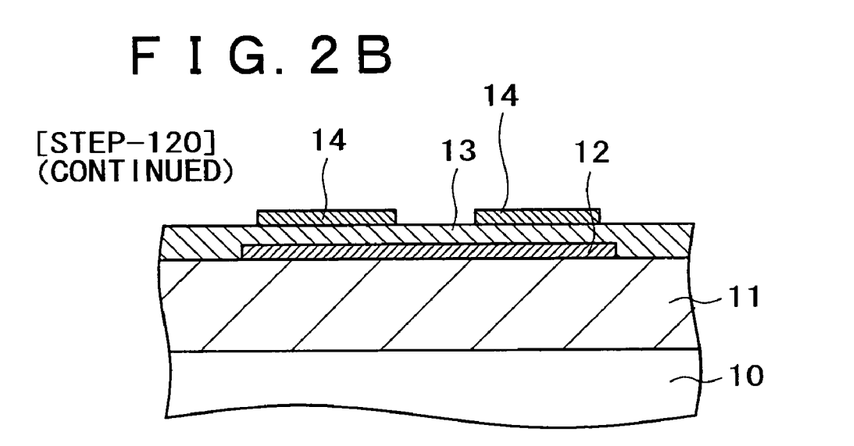
Figure 2C:
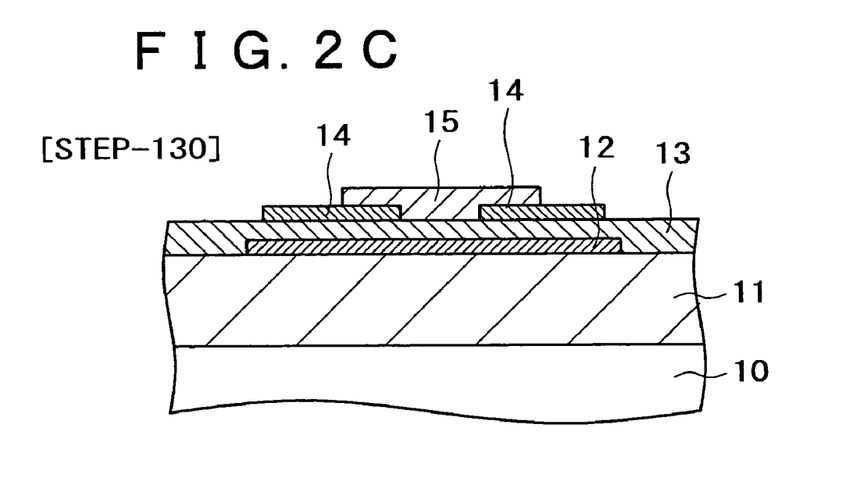

The resist layer 32 is formed on the gate insulating layer 13 and then patterned by the lithography technology such that the part where the source/drain electrodes 14 are to be formed is removed. See FIG. 1D. It is desirable to carry out ashing with oxygen plasma to remove residues of the resist layer 32 after the resist layer 32 has been formed. Treatment with a silane coupling agent is performed on the exposed surface of the gate insulating film 13 in the same way as in Step 100. Subsequently, on the resist layer 32 and the gate insulating layer 13 is formed a metal single-layer film of gold (Au). In this way, there is obtained the source/drain electrodes 14 of metal single-layer film formed from gold (Au), as shown in FIG. 2A. The resist layer 32 is removed by the lift-off method such that the source/drain electrodes 14 of metal single-layer film remain on the gate insulating film 13. In this way, the source/drain electrodes 14 are formed on the gate insulating film 13. See FIG. 2B.

Step 130

Then, on the gate insulating film 13 between the source/drain electrodes 14 is formed the channel-forming region 15 as a semiconductor layer. See FIG. 2C. An organic semiconductor layer of pentathene is formed by vacuum vapor deposition on the source/drain electrodes 14 and the gate insulating film 13. When the organic semiconductor layer is formed, the gate insulating film 13 and the source/drain electrodes are partly covered by a hard mask, so that the channel forming region 15 can be formed without the photolithography process.

Thus Steps 100 to 130 mentioned above achieve the method for producing field effect transistors pertaining to the fourth embodiment of the present invention and the method for forming a metal single-layer film pertaining to the present invention.

Step 140

Over the entire surface is formed the inter-layer insulating layer 20 of $SiO_2$. An opening is formed in that part of the inter-layer insulating layer 20 which is above the word wire (extending from the gate electrode 12) and the source/drain electrodes 14.

Treatment with a silane coupling agent is performed on the surface of the inter-layer insulating layer 20 (corresponding to the support) in the same way as Step 100 in Example 1.

Then, a metal single-layer film is formed on the surface of the support (inter-layer insulating layer 20) which has been treated with a silane coupling agent. A metal single-layer film is formed from gold (Au) by vacuum deposition on the inter-layer insulating layer 20 including the opening. Then the metal single-layer film is selectively removed (or patterned) by etching. In this way, it is possible to form on the inter-layer insulating layer 20 (as the substrate) the wiring (not shown) connected to the word line extending from the gate electrode 12 and the wiring 21 connected to the source/drain electrodes 14. See FIG. 3. Thus there is obtained the TFT pertaining to Example 1.

Thus Step 140 mentioned above achieves the method for forming wiring pertaining to an embodiment of the present invention and the method for forming a metal single-layer film pertaining to an embodiment of the present invention.

The thus obtained TFT was tested for channel mobility. The result was $2.0 \times 10^{-1}$ cm$^2$/(V·s). For comparison, a sample of TFT was prepared which has an adhesion layer of titanium (Ti) formed in place of Step 120 and also has source/drain electrodes formed from gold (Au). This sample was found to have a channel mobility of $7.1 \times 10^{-3}$ cm$^2$/(V·s). In other words, the TFT produced by the method of the present invention has a two-order magnitude higher channel mobility than the conventional TFT. Moreover, it showed no sign of peeling in the source/drain electrode 14, gate electrode 12, and wiring 12.

EXAMPLE 2

This example demonstrates the method for producing field effect transistors according to an embodiment of the present invention, the method for forming wiring according to an embodiment of the present invention, and the method for forming a metal single-layer film according to an embodiment of the present invention. The field effect transistor (more specifically TFT) obtained in this example has a structure as shown in FIG. 5, which is a schematic partial sectional view taken along a virtual plane perpendicular to the direction in which the gate electrode extends.

The field effect transistor pertaining to Example 2 is that of so-called bottom gate type or TFT of top contact type. It is composed of source/drain electrodes 14 formed on the substrate, a channel forming region 15 of semiconductor layer which is formed on the substrate (or the insulating layer 111) and between the source/drain electrodes 14, a gate insulting film 13 formed on the semiconductor layer, and a gate electrode 12 formed on the gate insulating film 13.

Over the entire surface is formed the inter-layer insulating layer 20 of $SiO_2$, on which is formed the wiring 21. An opening is formed in that part of the inter-layer insulating layer 20 which is above the word wire extending from the gate electrode 12 and the source/drain electrodes 14. The wiring 21 extends in this opening and connects to the word line and the source/drain electrodes 14.

Figure 5:
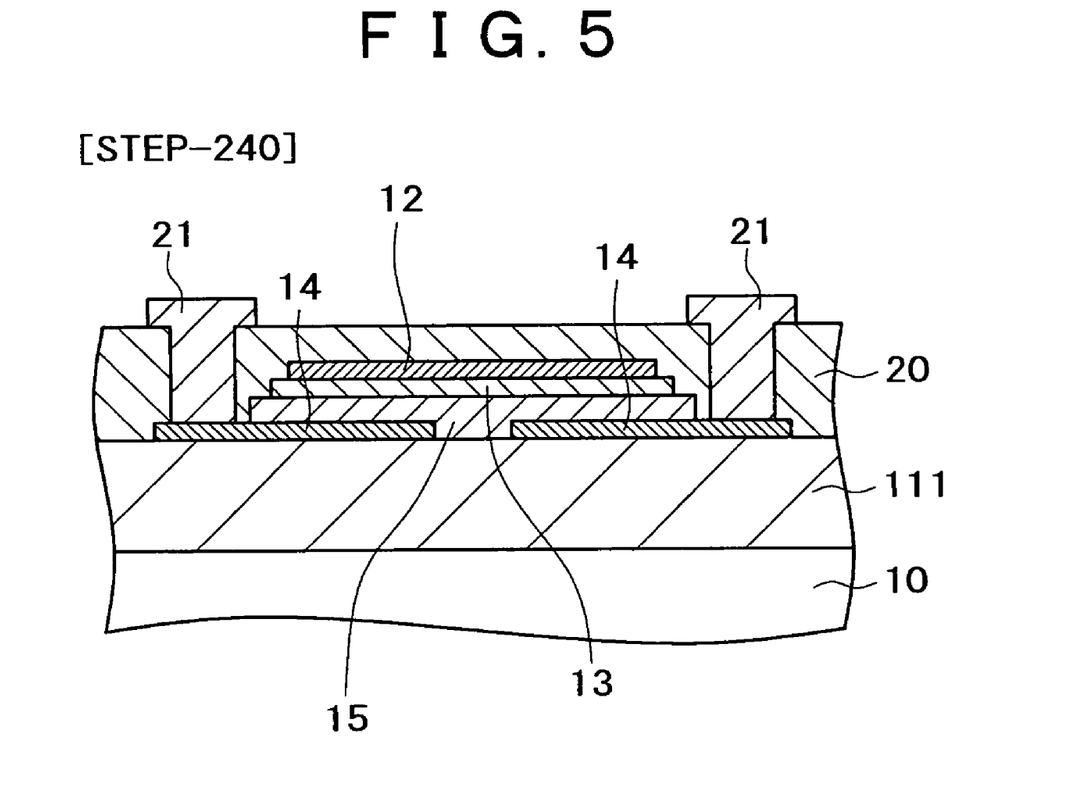
FIG. 5 as the continuation of FIG. 4D is a schematic sectional view illustrating the method for producing the field effect transistor in Example 2.

The TFT shown in FIG. 5 is produced by the method for producing field effect transistors pertaining to the fifth embodiment of the present invention. In this case, the gate electrode 12 which functions also as the word line is regarded as the wiring, and the gate electrode 12 (wiring) is formed by the method for forming wiring pertaining to the first embodiment of the present invention and the wiring 21 on the inter-layer insulating layer 20 is formed by the method for forming wiring pertaining to the second embodiment of the present invention.

In Example 2, the semiconductor layer constituting the channel forming region 15 was formed from the same semiconductor material as in Example 1. And, the substrate is the insulating layer 111 of $SiO_2$. The insulating layer 111 is formed by sputtering on the surface of the glass substrate 10 as the support. The gate electrode 12, the source/drain electrodes 14, and the wiring 21 were formed from metal single-layer film of gold (Au). The gate insulating film 13 was formed from $SiO_2$. The inter-layer insulating layer 20 was formed from $SiO_2$. In other words, the gate insulating film 13 corresponds to the substrate in the method for forming wiring pertaining to the second embodiment of the present invention, the inter-layer insulating layer 20 corresponds to the substrate in the method for forming wiring pertaining to the third embodiment of the present invention, and the insulating layer 111, the gate insulating film 13, or the inter-layer insulating layer 20 corresponds to the substrate in the method for forming metal single-layer film pertaining to the first embodiment of the present invention.

The following is an outline of the method for producing the field effect transistor in Example 2. The outline will be explained with reference to FIGS. 4 and 5, which are schematic sectional views as previously discussed.

Step 200

Figure 4A:
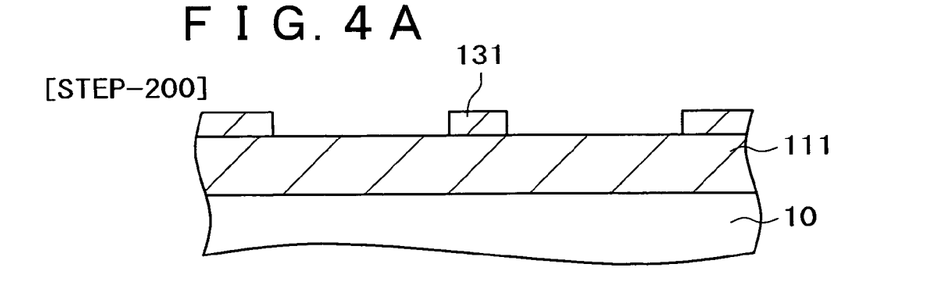
FIGS. 4A to 4D are schematic sectional views illustrating the method for producing the field effect transistor in Example 2.
Figure 4B:
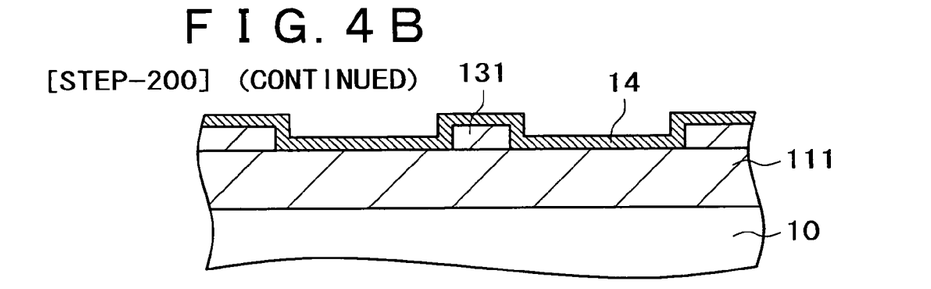
Figure 4C:
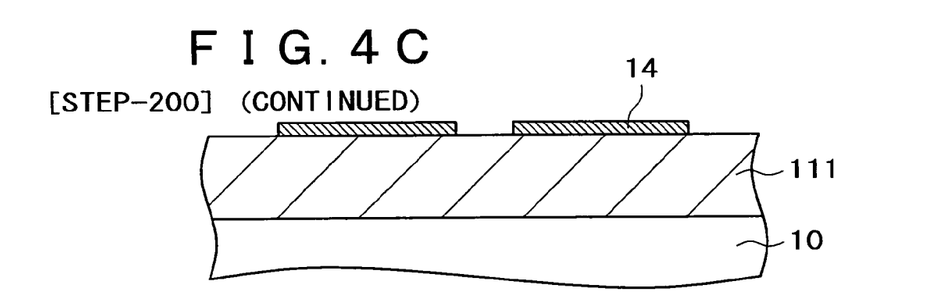
Figure 4D:
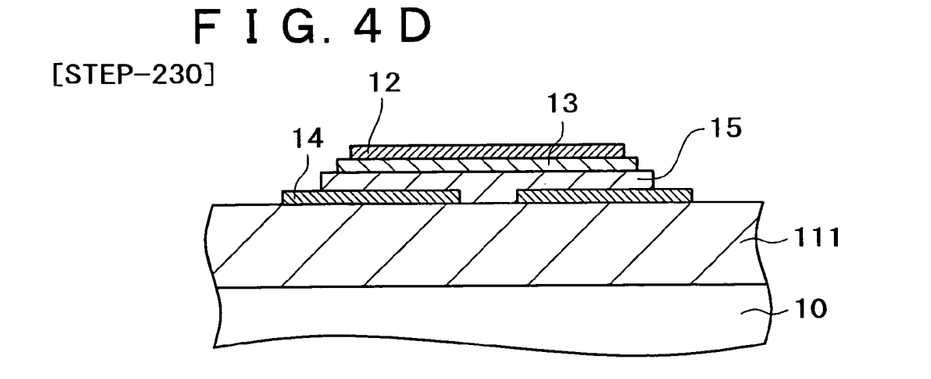

The first step is to perform treatment with a silane coupling agent on the surface of the substrate. On the surface of the substrate, which has been treated with a silane coupling agent, are formed the source/drain electrodes. To be concrete, the resist layer 131 is formed by lithography on the insulating layer 111 of $SiO_2$ as the substrate in the same way as in Step 120 of Example 1. The resist layer 131 is patterned such that the part where the source/drain electrodes 14 are to be formed is removed. See FIG. 4A. Incidentally, it is desirable to carry out ashing with oxygen plasma to remove residues of the resist layer 131 after the resist layer 131 has been formed. Treatment with a silane coupling agent is performed on the exposed surface of the insulating layer 111 in the same way as in Step 100 in Example 1. Then a metal single-layer film of gold (Au) is formed by vacuum vapor deposition on the resist layer 131 and the substrate insulating layer 111. In this way, there is obtained the source/drain electrodes 14 composed of metal single-layer film of gold (Au), as shown in FIG. 4B. After that, the resist layer 131 is removed by the lift-off method, such that the source/drain electrodes 14 composed of metal single-layer film remain on the substrate insulating layer 111. In this way, the source/drain electrodes 14 are formed on the substrate insulating layer 111. See FIG. 4C.

Step 210

A semiconductor layer is formed on the source/drain electrodes 14 and on that part of the substrate insulating layer 111 which is held between the source/drain electrodes 14. In this way there is obtained the channel-forming region 15 composed of semiconductor layer on that part of the substrate insulating layer 111 which is held between the source/drain electrodes 14. The same organic semiconductor layer as used in Example 1 is formed by vacuum deposition on the source/drain electrodes 14 and the insulating layer 111 in the same way as in Step 130 in Example 1.

Step 220

Subsequently, the gate insulating film 13 is formed on the semiconductor layer. To be concrete, the gate insulating film 13 of $SiO_2$ is formed by sputtering over the entire surface in the same way as in Step 110 in Example 1.

Step 230

Then, the gate insulating film 13 is formed on the gate electrode 12. To be concrete, a resist layer (not shown) is formed on the gate insulating film 13 corresponding to the substrate and the resist layer is patterned by the lithography technology such that the part on which the gate electrode 12 corresponding to the wiring is to be formed is removed, in the same way as in Step 100 in Example 1. It is desirable to perform ashing with oxygen plasma to remove residues of the resist layer after the resist layer has been formed.

Treatment with a silane coupling agent is performed on the exposed surface of the substrate such as the gate insulating film 13 in the same way as in Step 100 in Example 1. Then, a metal single-layer film of gold (Au) is formed by vacuum deposition on the resist layer and the substrate, such as the gate insulating film 13. In this way there is obtained the gate electrode 12 which is composed of a metal single-layer film of gold (Au). After that, the resist layer is removed by the lift-off method, such that the wiring, such as the gate electrode 12 of a metal single-layer film remains on the substrate, such as the gate insulating film 13. In this way, it is possible to form the gate electrode 12 corresponding to the wiring on the gate insulating film 13 as the substrate. See FIG. 4D.

Thus Steps 200 to 230 mentioned above achieve the method for producing field effect transistors pertaining to the fifth embodiment of the present invention and the method for forming a metal single-layer film pertaining to the present invention. Also, Step 230 achieve the method for forming wiring pertaining to the second embodiment of the present invention and the method for forming a metal single-layer film pertaining to the first embodiment of the present invention.

Step 240

Then, the inter-layer insulating layer 20 of $SiO_2$ is formed over the entire surface in the same way as in Step 140 in Example 1. An opening is formed in that part of the inter-layer insulating layer 20 which is above the word wire (extending from the gate electrode 12) and the source/drain electrodes 14. Treatment with a silane coupling agent is performed on the surface of the inter-layer insulating layer 20 (corresponding to the substrate) in the same way as in Step 100 in Example 1. Then, a metal single-layer film is formed on the surface of the substrate which has been treated with a silane coupling agent. To be concrete, a metal single-layer film of gold (Au) is formed by vacuum deposition on the inter-layer insulating layer 20 including that part within the opening. The metal single-layer film is selectively removed (or patterned) by etching. In this way it is possible to form wiring (not shown) connected to the word line extending from the gate electrode 12 and the wiring 21 connected to the source/drain electrode 14 on the inter-layer insulating layer 20 as the substrate. See FIG. 5. In this way there is obtained the desired TFT in Example 2. The TFT showed no sign of peeling in the source/drain electrodes 14, the gate electrode 12, and the wiring 21.

Step 240 achieves the method for forming wiring pertaining to an embodiment of the present invention and the method for forming a metal single-layer film pertaining to an embodiment of the present invention.

Although the invention has been described with reference to preferred examples, the invention is not limited by them.

The structure and manufacturing conditions of the field effect transistor are exemplary illustrations of the present invention that may be suitably modified. In Examples 1 and 2, the gate electrode (wiring) may be formed by the method for forming wiring pertaining to the third embodiment of the present invention, or the wiring 21 on the inter-layer insulating layer 20 may be formed by the method for forming wiring pertaining to the second embodiment of the present invention. The structure of the wiring obtained by the method for forming wiring according to an embodiment of the present invention is not limited to the structure of the wiring explained in Examples. In the case where the field effect transistor (TFT) obtained in the present invention is applied to or used in display units or various electronic instruments, it may be made into a monolithic integrated circuit consisting of a large number of TFT's on the support or supporting member. Alternatively, TFT's may be cut into individual pieces for use as discrete parts.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A method for forming a wiring comprising:
   forming directly on a uniform non-patterned $SiO_2$—based substrate a resist layer from which a part thereof where wiring is to be formed has been removed;
   ashing the resist layer with oxygen plasma;
   treating with a silane coupling agent an exposed surface of the substrate, wherein the silane coupling agent is $(CH_3O)_3SiC_3H_3SH$;
   forming a metal single-layer film on the resist layer and the uniform non-patterned substrate, wherein the metal single-layer film is formed from one species of metal selected from the group consisting of gold, platinum, silver, palladium, rubidium, and rhodium; and
   removing the resist layer so as to leave on the substrate the wiring of metal single-layer film.

2. A method for forming a wiring comprising:
   treating with a silane coupling agent a surface of a substrate, wherein the silane coupling agent is $(CH_3O)_3SiC_3H_3SH$;
   forming a metal single-layer film on the surface of the substrate which has been treated with the silane coupling agent, wherein the metal single-layer film is formed from one species of metal selected from the group consisting of gold, platinum, silver, palladium, rubidium, and rhodium; and
   selectively removing the metal single-layer film by etching, thereby forming wiring of the metal single-layer film on the substrate.

3. A method for producing a field-effect transistor comprising:
   forming a gate electrode on a support;
   forming a uniform non-patterned gate insulating film on the gate electrode;
   forming directly on the gate insulating film a resist layer from which a part thereof where source/drain electrodes are to be formed has been removed
   treating with a silane coupling agent the surface of the gate insulating film, wherein the silane coupling agent is a compound represented by X—$Si(OR)_3$, where X is a functional group selected from the group consisting of thiol, amino, vinyl, epoxy, chloro, methacryl, methoxy and ethoxy;
   forming source/drain electrodes of a metal single-layer film on the gate insulating film and the resist layer which have been treated with a silane coupling agent; and
   forming a channel-forming region of semiconductor material on the gate insulating film between the source/drain electrodes, wherein the field-effect transistor has a channel mobility greater than about $7.1 \times 10^{-3}$ $cm^2/(V*S)$.

4. The method for producing a field effect transistor as defined in claim 3, wherein the gate insulating film is formed from an $SiO_2$-based material and the metal single-layer film is formed from one species of metal selected from the group consisting of gold, platinum, silver, palladium, rubidium, and rhodium.

5. A method for producing a field-effect transistor comprising:
   forming directly on a substrate a resist layer from which parts thereof where source/drain electrodes are to be formed have been removed;
   ashing the resist layer with oxygen plasma;
   treating with a silane coupling agent exposed surfaces of the substrate;
   forming source/drain electrodes of metal single-layer film on the resist layer and the surface of the substrate which have been treated with a silane coupling agent;
   removing the resist layer so as to leave on the substrate the source/drain electrodes;
   forming a layer of semiconductor material on the source/drain electrodes and on the substrate therebetween, thereby forming a channel-forming region of semiconductor layer between the source/drain electrodes;
   forming a gate insulating film on the layer of semiconductor material; and
   forming a gate electrode on the gate insulating film, wherein the field-effect transistor has a channel mobility greater than about $7.1 \times 10^{-3}$ $cm^2/(V*S)$.

6. The method for producing a field effect transistor as defined in claim 5, wherein the substrate is formed from an $SiO_2$-based material and the metal single-layer film is formed from one species of metal selected from the group consisting of gold, platinum, silver, palladium, rubidium, and rhodium.

* * * * *